(12) United States Patent
Goel et al.

(10) Patent No.: US 11,411,571 B2
(45) Date of Patent: *Aug. 9, 2022

(54) PHASE-LOCKED LOOP MONITOR CIRCUIT

(71) Applicant: Taiwan Semiconductor Manufacturing Co., Ltd., Hsin-Chu (TW)

(72) Inventors: Sandeep Kumar Goel, Dublin, CA (US); Ji-Jan Chen, Kaohsiung (TW); Stanley John, Fremont, CA (US); Yun-Han Lee, Hsinchu County (TW); Yen-Hao Huang, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/330,818

(22) Filed: May 26, 2021

(65) Prior Publication Data
US 2021/0281268 A1  Sep. 9, 2021

Related U.S. Application Data

(63) Continuation of application No. 16/894,607, filed on Jun. 5, 2020, now Pat. No. 11,025,261, which is a continuation of application No. 16/372,706, filed on Apr. 2, 2019, now Pat. No. 10,680,627, which is a continuation of application No. 15/711,201, filed on Sep. 21, 2017.

(60) Provisional application No. 62/427,724, filed on Nov. 29, 2016.

(51) Int. Cl.
| | |
|---|---|
| H03L 7/06 | (2006.01) |
| H03L 7/07 | (2006.01) |
| H03L 7/23 | (2006.01) |
| H03L 7/091 | (2006.01) |
| H03L 7/095 | (2006.01) |
| H03K 19/21 | (2006.01) |

(52) U.S. Cl.
CPC ............... *H03L 7/23* (2013.01); *H03L 7/091* (2013.01); *H03L 7/095* (2013.01); *H03K 19/21* (2013.01)

(58) Field of Classification Search
None
See application file for complete search history.

(56) References Cited

U.S. PATENT DOCUMENTS

| | | |
|---|---|---|
| 5,748,569 A | 5/1998 | Teodorescu |
| 6,469,550 B1 | 10/2002 | Kurd |
| 6,577,174 B2 | 6/2003 | Locker |

(Continued)

*Primary Examiner* — Kenneth B Wells
(74) *Attorney, Agent, or Firm* — Duane Morris LLP

(57) ABSTRACT

A clock distribution circuit configured to output a clock signal includes a first circuit configured to use a reference clock signal to provide first and second reference signals, wherein the second reference signal indicates whether the first reference signal is locked with the reference clock signal; a second circuit configured to use the reference clock signal to provide an output signal and an indication signal indicative whether the output signal is locked with the reference clock signal; and a monitor circuit, coupled to the first and second circuits, and configured to use at least one of the first reference signal, the second reference signal, the output signal, and the indication signal to determine whether the second circuit is functioning correctly.

19 Claims, 8 Drawing Sheets

(56) References Cited

U.S. PATENT DOCUMENTS

| | | |
|---|---|---|
| 8,633,749 B2 | 1/2014 | Bass |
| 10,256,828 B2 * | 4/2019 | Goel ........................ H03L 7/23 |
| 10,680,627 B2 | 6/2020 | Goel et al. |
| 11,025,261 B2 * | 6/2021 | Goel ........................ H03L 7/23 |

* cited by examiner

PHASE-LOCKED LOOP MONITOR CIRCUIT

CROSS-REFERENCE TO RELATED APPLICATION

The present application is a continuation of U.S. patent application Ser. No. 16/894,607, filed Jun. 5, 2020, which is a continuation of U.S. patent application Ser. No. 16/372, 706, filed Apr. 2, 2019 (now U.S. Pat. No. 11,025,261), which is a continuation application of U.S. patent application Ser. No. 15/711,201, filed on Sep. 21, 2017 (now U.S. Pat. No. 10,256,828), which claims priority to U.S. Provisional Patent Application No. 62/427,724, filed on Nov. 29, 2016, each of which are incorporated by reference herein in their entireties.

BACKGROUND

Phase locked loop ("PLL") circuits have been used extensively in analog electrical systems and communication systems. In today's high performance systems operating within increasingly stringent timing constraints, PLL circuits have also been used in digital electronic circuits and/or mixed-signal (i.e., analog and digital) circuits. For example, a PLL circuit that serves as a clock signal distributer is commonly included in a system-on-chip (SoC) circuit to be used in a variety of applications such as, for example, automotive applications (e.g., Automotive Safety Integrity Level (ASIL) applications), Application Specific Integrated Circuits (ASICs), etc.

Some key advantages that a PLL circuit brings to clock distribution are phase/delay compensation, frequency multiplication and duty cycle correction. A PLL circuit enables a periodic signal or a clock signal to be phase-aligned with frequency multiples of a reference clock signal. As the name (i.e., phase locked) implies, an output of the PLL circuit locks onto the incoming reference clock signal and generates a periodic output signal with a frequency equal to the average frequency of the reference clock signal. When the PLL output signal (i.e., the output of the PLL circuit) tracks the reference clock signal such that a difference between a phase of the PLL output signal and a phase of the reference clock signal is constant over time, the PLL circuit is said to be "locked."

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
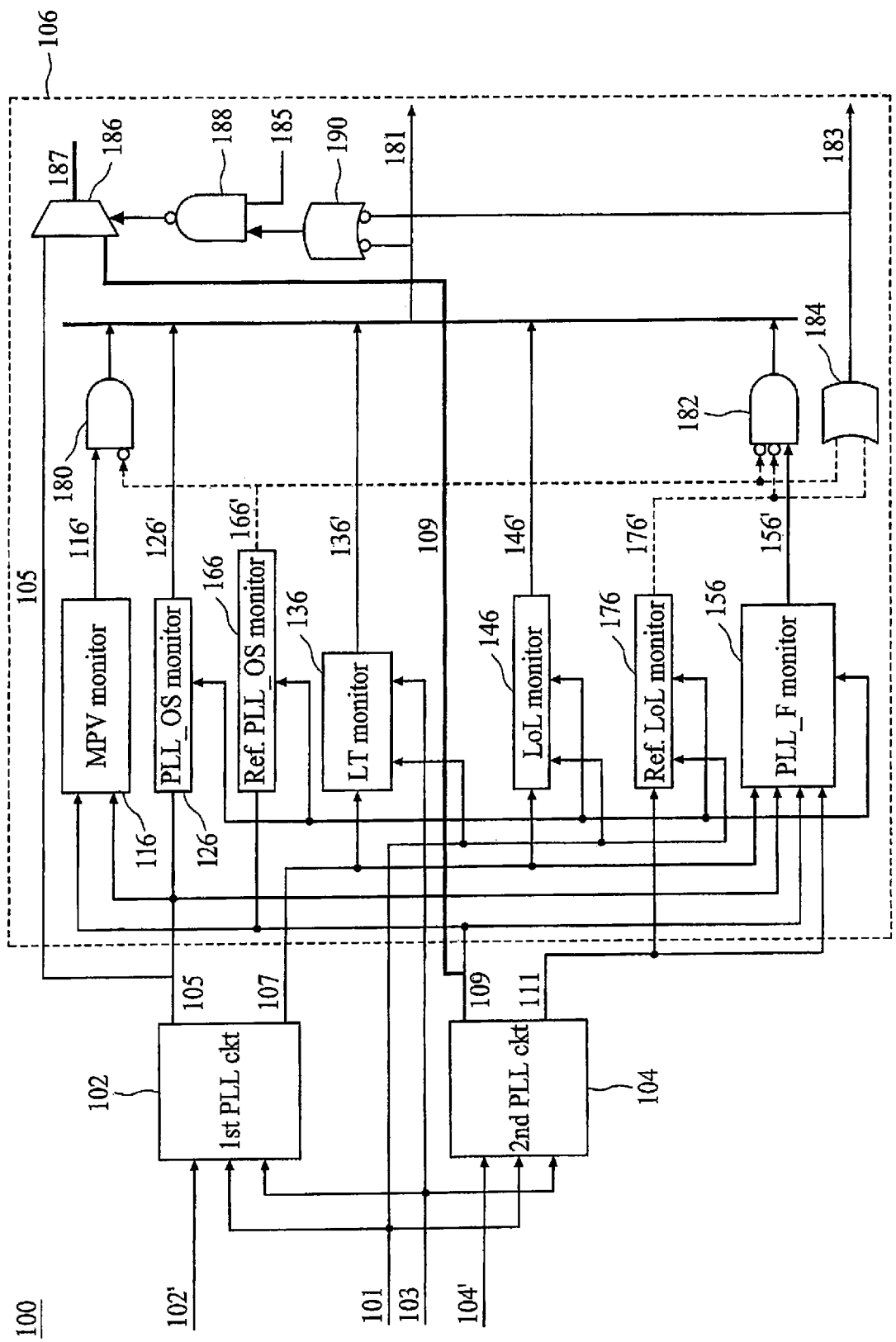
FIG. 1 illustrates an exemplary block diagram of a phase locked loop (PLL) architecture including a PLL monitor circuit, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

Given the general use of a PLL (phase locked loop) circuit in the SoC's for various types of applications, as described above, performance and reliability of the PLL circuit may determine an overall performance of the SoC. Various issues that are rooted from the PLL circuit may disadvantageously impact the overall performance of the SoC. For example, the PLL circuit may provide an incorrect result such as an incorrect frequency of a PLL output signal (e.g., a clock signal), an incorrect duty cycle of an PLL output signal, a stuck or a floating PLL output signal (e.g., stuck either at a high or a low logic state), etc. In another example, the PLL circuit may provide an unreliable result such as a loss of a previously locked PLL output signal, one or more missing pulses of a PLL output signal, one or more extra (e.g., unneeded) pulses of a PLL output signal, a PLL output signal associated with an intolerable amount of jitter noise, etc. Yet in another example, although the PLL circuit may ultimately provide a correct and reliable PLL output signal that is eventually locked, the PLL circuit may take an amount of time that exceeds a pre-defined threshold, which disadvantageously impacts the overall performance of the SoC.

The present disclosure provides various embodiments of a PLL architecture that can self-detect presence of one or more of the above-mentioned issues, and thus assures a provided PLL output signal (e.g., a clock signal) is correct and reliable. In some embodiments, the PLL architecture includes a reference PLL circuit, a main PLL circuit, and a PLL monitor circuit coupled to the reference PLL circuit and main PLL circuit. The PLL monitor circuit is configured to dynamically detect presence of one or more of the above-mentioned issues that may occur in the main PLL circuit. The term "dynamically" as used herein refers to a scenario in which the PLL monitor circuit can monitor and detect any one or more of the above-mentioned issues whenever the main PLL circuit is operating (e.g., before and/or after a PLL output signal is locked), in accordance with various embodiments. By dynamically monitoring the main PLL circuit, a SoC circuit using the disclosed PLL architecture as a signal clock distributer/source may be notified before any further negative impact occurs to the whole SoC circuit. Moreover, in some embodiments, the PLL monitor circuit uses one or more PLL reference signals, provided by the reference PLL circuit, to detect whether one or more of the above-mentioned issues occur during the operation of the main PLL circuit. In such embodiments, the disclosed PLL architecture can self-examine the reference PLL circuit to determine whether the PLL reference signal(s) are reliable to be used thereby assuring the one or more of the above-mentioned issues are accurately detected.

FIG. 1 illustrates an exemplary block diagram of a disclosed PLL architecture 100, in accordance with various embodiments. As shown, the PLL architecture 100 includes a first PLL circuit 102 (hereinafter "main PLL circuit"), a second PLL circuit 104 (hereinafter "reference PLL circuit"), and a PLL monitor circuit 106 coupled to the main PLL circuit 102 and the reference PLL circuit 104.

As mentioned above, each PLL circuit is configured to "lock" a PLL output signal with a reference clock signal. For example, in some embodiments, the main PLL circuit 102 is configured to receive an input signal 101 that may be used as a reference clock signal of the main PLL circuit 102, and perform one or more corresponding PLL functions, which will be briefly discussed below, to provide two output signals 105 and 107. In some embodiments, the signal 105 may be the above-mentioned PLL output signal (i.e., a clock signal) that is configured to be locked with the reference clock signal 101. And the signal 107 may be used to indicate whether the main PLL circuit 102 is locked (i.e., whether the signal 105 is locked with the reference clock signal 101). Further, in some embodiments, the main PLL circuit 102 is configured to receive signal 103 that may be used to reset the main PLL circuit 102, and signal 102' including one or more parameters that may be used to control one or more respective PLL functions of the main PLL circuit 102. Similarly, the reference PLL circuit 104 is configured to receive signals 101, 103, and 104'. In some embodiments, the reference PLL circuit 104 also uses the signal 101 as its reference clock signal, the signal 103 to reset the reference PLL circuit 104, and the signal 104' for controlling respective PLL function(s), as described above. The reference PLL circuit 104 may also provide signal 109 as its PLL output signal, and signal 111 indicating whether the PLL output signal 109 is locked with the reference clock signal 101.

In some embodiments, each of the main and reference PLL circuits 102 and 104 includes one or more circuit components to perform a respective PLL function. For example, the one or more circuit components include: a phase frequency detector (PFD) configured to receive a reference clock signal (e.g., 101) and provide up and down signals; a charge pump (CP), coupled to the PFD, and configured to use the up and down signals to generate a boosted signal; a filter circuit coupled to the CP configured to receive the boosted signal and provide a filtered signal; a voltage control oscillator (VCO) configured to use the filtered signal to provide a PLL output signal (e.g., 105, 109, etc.); and a divider coupled between the VCO and the PFD as a feedback path so as to allow the PLL output signal to be a multiple of the reference clock signal. Each of the above-described PLL functions of the main PLL circuit 102 and reference PLL circuit 104 may be provided in accordance with the signals 102' and 104', respectively. It is understood that the one or more circuit components of each PLL circuit are merely provided for exemplification purpose so that each of the PLL circuits (102 and 104) may include additional circuit components while remaining within the scope of the present disclosure.

In some embodiments, the reference PLL circuit 104 is configured to provide one or more reference signals for the PLL monitor circuit 106 to detect whether one or more of the above-mentioned issues happen to the main PLL circuit 102. Thus, for clarity, the PLL output signal 109 of the reference PLL circuit 104 is also referred to herein as the "first PLL reference signal," and the signal 111 of the reference PLL circuit 104 is also referred to herein as the "second PLL reference signal."

In some embodiments, the PLL monitor circuit 106 is configured to use the signal 105, the signal 107, the first PLL reference signal 109, and/or the second PLL reference signal 111 to determine whether the main PLL circuit 102 functions correctly, i.e., no presence of any one of the above-mentioned issues. As shown in the illustrated embodiment of FIG. 1, the PLL monitor circuit 106 includes a minimum pulse violation (MPV) monitor 116, a PLL output signal (PLL_OS) monitor 126, a lock time (LT) monitor 136, a loss-of-lock (LoL) monitor 146, and a PLL frequency (PLL_F) monitor 156, which will be described in further detail below with respect to FIGS. 2A, 2B, 2C, 2D, and 2E, respectively.

In some embodiments, the PLL monitor circuit 106 may further include a reference PLL_OS monitor 166, and a reference LoL monitor 176. As the term "reference" implies, the reference PLL_OS monitor 166 and the reference LoL monitor 176 are configured to examine whether the reference PLL circuit 104 functions correctly by examining the first and second PLL reference signals (109 and 111). As such, the first and second PLL reference signals (109 and 111) may each be used as a reliable basis/reference by the MPV monitor 116, the PLL_OS monitor 126, the LT monitor 136, the LoL monitor 146, and/or the PLL_F monitor 156 to examine the main PLL circuit 102. In some embodiments, the reference PLL_OS monitor 166 is substantially similar to the PLL_OS monitor 126; and the reference LoL monitor 176 is substantially similar to the LoL monitor 146. Accordingly, discussions of the reference PLL_OS monitor 166 and the reference LoL monitor 176 will be provided in accordance with FIGS. 2B and 2D, respectively.

According to various embodiments of the present disclosure, each of the monitors (116, 126, 136, 146, 156, 166, and 176) of the PLL monitor circuit 106 may be configured to provide a respective output signal (116', 126', 136', 146', 156', 166', and 176') indicative of whether one or more corresponding issues of either the main PLL circuit 102 or the reference PLL circuit 104 are detected. The following provides some non-limiting examples of issues that can be detected. For example, the MPV monitor 116 may output the signal 116' at a high logical state if presence of an incorrect duty cycle (e.g., a violation of a minimum pulse width) of the PLL output signal 105 is detected; the PLL_OS monitor 126 may output the signal 126' at a high logical state if the PLL output signal 105 is detected as stuck or floating, and/or includes one or more missing pulses; the LT monitor 136 may output the signal 136' at a high logical state if the main PLL circuit 102 exceeds a predetermined amount of time to provide a locked PLL output signal (e.g., 105); the LoL monitor 146 may output the signal 146' at a high logical state if a loss of a previously locked PLL output signal (e.g., 105) is detected; the PLL_F monitor 156 may output the signal 156' at a high logical state if at least one of the following issues is detected: an incorrect frequency of the PLL output signal 105, one or more missing pulses of the PLL output signal 105, one or more extra pulses of the PLL output signal 105, and the PLL output signal 105 is associated with an intolerable amount of jitter noise; the reference PLL_OS monitor 166 may output the signal 166' at a high logical state if it is detected that the first PLL reference signal 109 is stuck or floating, and/or one or more pulses of the signal 109 is missing; and the reference LoL monitor 176 may output the signal 176' at a high logical state if a loss of a previously locked PLL output signal (e.g., the first PLL reference signal 109) is detected.

In some embodiments, the PLL monitor circuit 106 may further include one or more logic gates and circuit components coupled to one or more of the monitors (116, 126, 136, 146, 156, 166, and 176). For example, as shown in FIG. 1, the PLL monitor circuit 106 includes logic gates 180, 182, 184, 188 and 190, and multiplexer 186, wherein the logic gates 180 and 182 each includes an AND logic gate (hereinafter "AND gate"), the logic gate 188 includes a NAND logic gate (hereinafter "NAND gate"), and logic gates 184 and 190 each includes an OR logic gate (hereinafter "OR gate"). It is also understood that each of the logic gates (180, 182, 184, 188 and 190) may include any of a variety of logic gates that can perform a desired logic function while remaining within the scope of the present disclosure. More specifically, in some embodiments, the AND gate 180 is configured to receive the signal 116' and a logical inversion of the signal 166' at its inputs, and perform an AND logic function on the received signals (116' and 166') so as to provide an output signal 181. Similarly, the AND gate 182 is configured to receive the logical inversion of the signal 116', the signal 156', and a logical inversion of the signal 176' at its inputs, and perform an AND logic function on the received signals (116', 156' and 176') so as to provide the output signal 181. As such, a logical state of the signal 181 may be determined based on a combination of logical states of the signals 116', 156' 166', and 176'. In some embodiments, the signal 181 may be indicative of one or more detected issues of the "main" PLL circuit 102, which will be discussed in further detail below with respect to FIGS. 2A-2E.

In some embodiments, the OR gate 184 is configured to receive the signal 166', and the signal 176' at its inputs, and perform an OR logic function on the received signals (166' and 176') so as to provide an output signal 183. As such, a logical state of the signal 183 may be determined based on a combination of logical states of the signals 166' and 176'. In some embodiments, the signal 183 may be indicative of one or more detected issues of the "reference" PLL circuit 104, which will be discussed in further detail below with respect to FIGS. 2A-2E.

Referring still to FIG. 1, in some embodiments, the PLL monitor circuit 106 may further use signals 181 and 183 to provide a "clock selection" function. In such embodiments, the PLL monitor circuit 106 may use the OR gate 190 to receive logical inversions of the signals 181 and 183. Further, the PLL monitor circuit 106 may use the NAND gate 188 to enable the multiplexer 186 in response to a selection enable signal 185, and the multiplexer 186 to selectively output either the PLL output signal 105 (provided by the main PLL circuit 102) or the PLL reference signal 109 (provided by the reference PLL circuit 104) as a clock signal 187 to a coupled SoC.

Figure 2A:
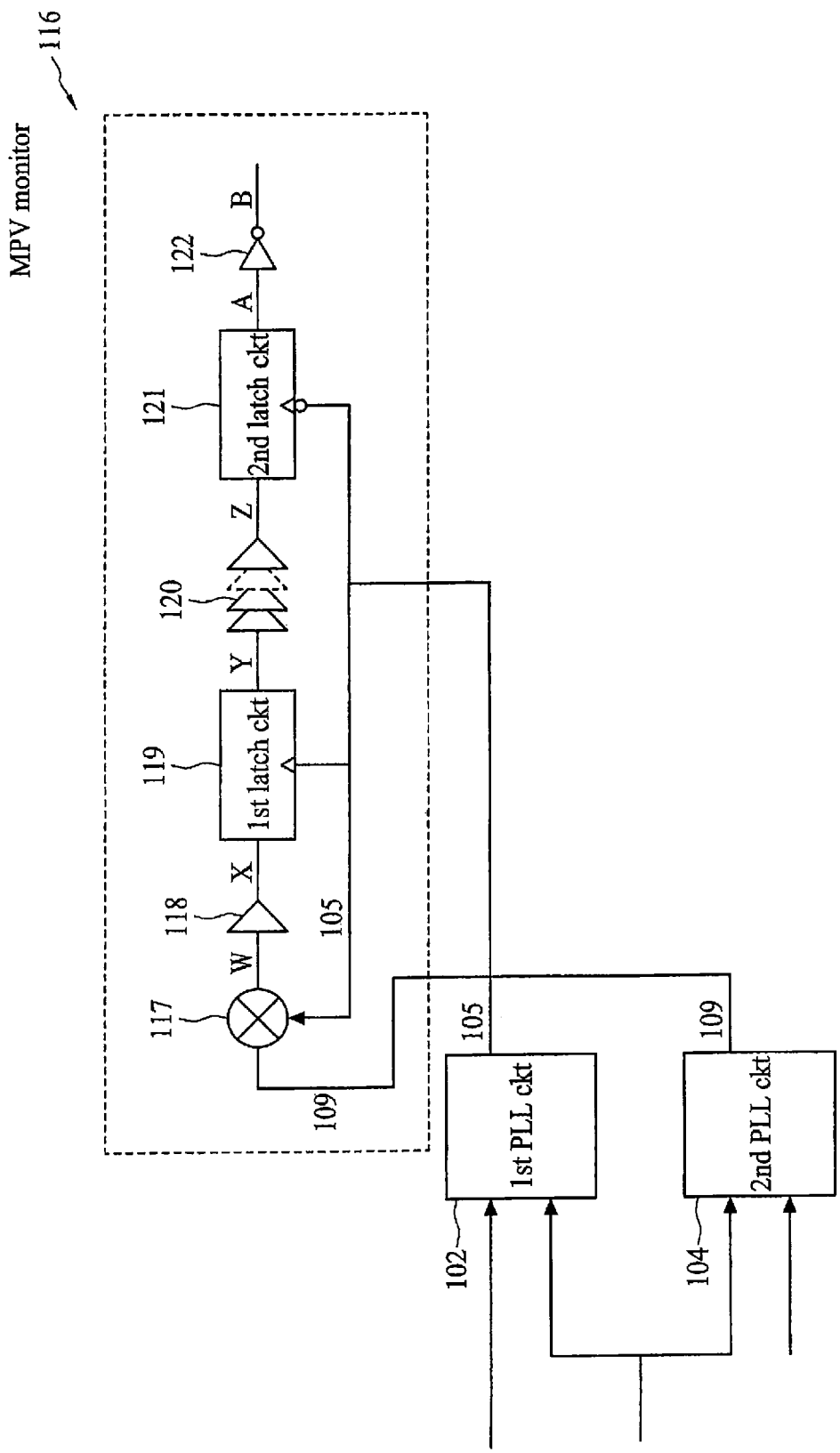
FIG. 2A illustrates an exemplary circuit diagram of a minimum pulse violation (MPV) monitor of the PLL monitor circuit of FIG. 1, in accordance with some embodiments.

Since each monitor of the PLL monitor circuit 106 is coupled to at least one of the main PLL circuit 102 and the reference PLL circuit 104, in the following discussions with respect to FIGS. 2A-2E, the main PLL circuit 102 and the reference PLL circuit 104 will be shown in each of FIGS. 2A-2E for clarity purposes. FIG. 2A illustrates an exemplary circuit diagram of the MPV monitor 116 coupled to the main PLL circuit 102 and the reference PLL circuit 104, in accordance with various embodiments. As shown, the MPV monitor 116 includes: a mixer 117, an optional delay gate 118, a first latch circuit 119, one or more delay gates 120, a second latch circuit 121, and an inverter 122, wherein each of the components (i.e., 117, 118, 119, 120, 121, and 122) of the MPV monitor 116 is coupled to one another in series.

In some embodiments, the mixer 117 is configured to heterodyne the PLL output signals 105 and 109 provided by the main PLL circuit 102 and the reference PLL circuit 104, respectively. In some embodiments, the mixer 117 may include an XOR logic gate. The delay gate 118 is configured to delay the heterodyned signal, i.e., a signal at node "W" (hereinafter "signal W") so as to provide a heterodyned signal with a gate delay, i.e., a signal at node "X" (hereinafter "signal X"). The first latch circuit 119 is configured to provide an output signal, i.e., a signal at node "Y" (hereinafter "signal Y") that tries to follow the signal X in accordance with a logical state of a clock signal (e.g., the PLL output signal 105), which will be described further below. The one or more delay gates 120 are configured to delay the signal Y with a pre-defined "minimum pulse width" delay so as to provide a signal at node "Z" (hereinafter "signal Z"). The second latch circuit 121 is configured to perform a similar function as the first latch circuit 119 except that the second latch circuit 121 is configured to provide an output signal at node "A" (hereinafter "signal A") that tries to follow the signal Z (an input signal of the second latch circuit 121) in accordance with a logical inversion of the PLL output signal 105. The inverter 122 is configured to provide a signal at node "B" (hereinafter "signal B") that is logically inverted to the signal A. In some embodiments, the first and second latch circuits (119 and 121) each includes a D flip-flop circuit. As would be understood by a person of ordinary skill in the art, an output signal of a D flip-flop circuit tries to follow an input signal of the D flip-flop circuit but the output signal cannot make a transition (as required by the input signal) unless enabled by either a rising or a falling edge of a clock signal received by the D flip-flop circuit.

By implementing the MPV monitor 116 in accordance with the circuit diagram of FIG. 2A, in some embodiments, the MPV monitor 116 can monitor whether the PLL output signal 105 (i.e., the clock signal provided by the main PLL circuit 102) includes a minimum pulse width violation. Generally, minimum pulse width examinations for a clock signal are performed to ensure that a width of the clock signal is wide enough for operations that relies on the clock signal to be completed, i.e., to ensure that the clock signal stays at a stable logical state (either a logical high or a logical low) for at least a duration of a certain "minimum" width.

Figure 3:
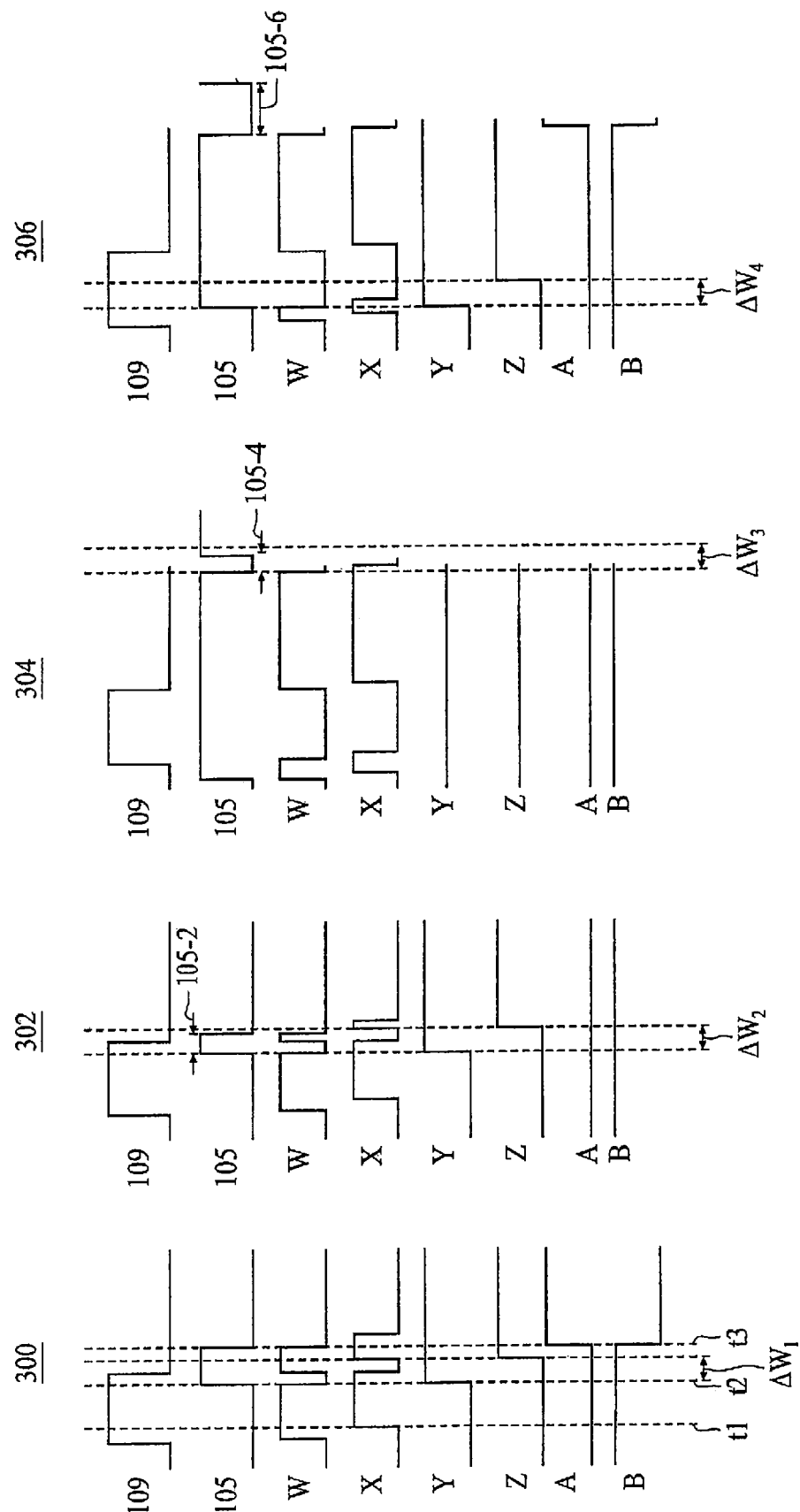
FIG. 3 illustrates plural sets of signal waveforms to operate the MPV monitor of FIG. 2A, in accordance with various embodiments.

FIG. 3 shows plural examples (300, 302, 304, and 306) each illustrating a scenario when a minimum pulse width violation of the PLL output signal 105 is either detected (i.e., a presence of a minimum pulse width violation) or not detected (i.e., a lack of a minimum pulse width violation), in accordance with various embodiments. More specifically, each example (300, 302, 304, and 306) includes plural waveforms of the PLL output signals 105 and 109, and the signals W, X, Y, Z, A, and B of FIG. 2A. Thus, discussions of the examples in FIG. 3 will be provided in conjunction with FIG. 2A.

Referring now to 300 of FIG. 3, the PLL output signals 105 and 109 are provided to the MPV monitor 116. In some embodiments, the PLL output signal 109 of the reference PLL circuit 104 is used by the MPV monitor 116 as a PLL reference signal to examine whether the PLL output signal 109, provided by the main PLL circuit 102, includes a minimum pulse width violation so that in such embodiments, the PLL reference signal 109 is assumed to be correct (e.g., not floating, not stuck, without a missing pulse, without losing a lock status, etc.). As described above, the signal W is a heterodyned signal of the signals 105 and 109, and the signal X is the heterodyned signal with a gate delay. Also, the signal X serves as the input signal to the first D flip-flop circuit 119. In some embodiments, the first D flip-flop circuit 119 provides the signal Y by following the signal X according to the PLL output signal 105. Based on the above-mentioned operation principle of the D flip-flop circuit, for example, the signal Y tries to follow the signal X, and when the signal X transitions from a logical low state (hereinafter "LOW") to a logical high state (hereinafter "HIGH") at time "t1," the signal Y tires to follow the transition. However, since the clock signal (i.e., 105) remains at LOW, the signal Y needs to wait until a next rising edge of the signal 105, which happens at time "t2," to transition to HIGH. In some embodiments, the one or more delay gates 120, coupled between the first and second D flip-flop circuits (119 and 121), are configured to delay the signal Y with a pre-defined minimum pulse width, which is "$\Delta W_1$" in the example 300, so as to provide the signal Z.

Following the operation principle of the D flip-flop circuit again, the second D flip-flop circuit 121 then outputs the signal A that follows the signal Z according to the logical inversion of the signal 105. More specifically, the signal A cannot transition from LOW to HIGH until a next falling edge of the signal 105, which happens at time "t3." Accordingly, the inverter 122 provides the signal B that is logically inverted to the signal A. In some embodiments, the signal B corresponds to the signal 116' (FIG. 1). That is, if the signal B transitions from HIGH to LOW (like the example 300) or stays at LOW after the MPV monitor 116 finishes examining at least one pulse of the PLL output signal 105, the MPV monitor 116 may determine that no presence of a minimum pulse width violation is detected, and thus assert the signal 116' to LOW. On the other hand, if the signal B transitions from LOW to HIGH or stays at HIGH (like the examples 302 and 304 to be discussed below) after the MPV monitor 116 finishes examining at least one pulse of the PLL output signal 105, the MPV monitor 116 may determine that a presence of a minimum pulse width violation is detected, and thus assert the signal 116' to HIGH. More specifically in the example 300, since the pulse of the PLL output signal 105 remains at a stable HIGH, in some embodiments, the MPV monitor 116 may further determine that the PLL output signal 105 has no minimum pulse width violation during a positive-edge flop.

Examples 302, 304, and 306 illustrate scenarios of the PLL output signal 105 having a minimum pulse width violation during a positive-edge flop, the PLL output signal 105 having a minimum pulse width violation during a negative-edge flop, and the PLL output signal 105 having no minimum pulse width violation during a negative-edge flop, respectively. Since each of the examples 302, 304, and 306 is derived based on the substantially similar operation of the MPV monitor 116, waveforms of each example will be discussed briefly below. In the example 302, the delay gates 120 have a pre-defined minimum pulse width "$\Delta W_2$". As shown, a pulse width of the signal 105, i.e., "105-2" shown in 302, is less (shorter) than $\Delta W_2$, so that the MPV monitor 116 may determine that the PLL output signal 105 has a minimum pulse width violation and output the signal 116' at HIGH accordingly. Moreover, since the pulse of the PLL output signal being examined stays at HIGH, the MPV monitor 116 may further determine that the PLL output signal 105 has a minimum pulse width violation during a positive-edge flop. In the example 304, the delay gates 120 have a pre-defined minimum pulse width "$\Delta W_3$". As shown, a pulse width of the signal 105, i.e., "105-4" shown in 304, is less (shorter) than $\Delta W_3$, so that the MPV monitor 116 may determine that the PLL output signal 105 has a minimum pulse width violation and output the signal 116' at HIGH accordingly. Moreover, since the pulse of the PLL output signal 105 being examined stays at LOW, the MPV monitor 116 may determine that the PLL output signal 105 has a minimum pulse width violation during a negative-edge flop. Similarly, in the example 306, the delay gates 120 have a pre-defined minimum pulse width "$\Delta W_4$". As shown, a pulse width of the signal 105, i.e., "105-6" shown in 306, is longer than $\Delta W_4$, so that the MPV monitor 116 may determine that the PLL output signal 105 has no minimum pulse width violation and output the signal 116' at LOW (i.e., transitioning the signal B from HIGH to LOW) accordingly. Moreover, since the pulse of the PLL output signal 105 being examined stays at LOW, the MPV monitor 116 may determine that the PLL output signal 105 doesn't have a minimum pulse width violation during a negative-edge flop.

Figure 2B:
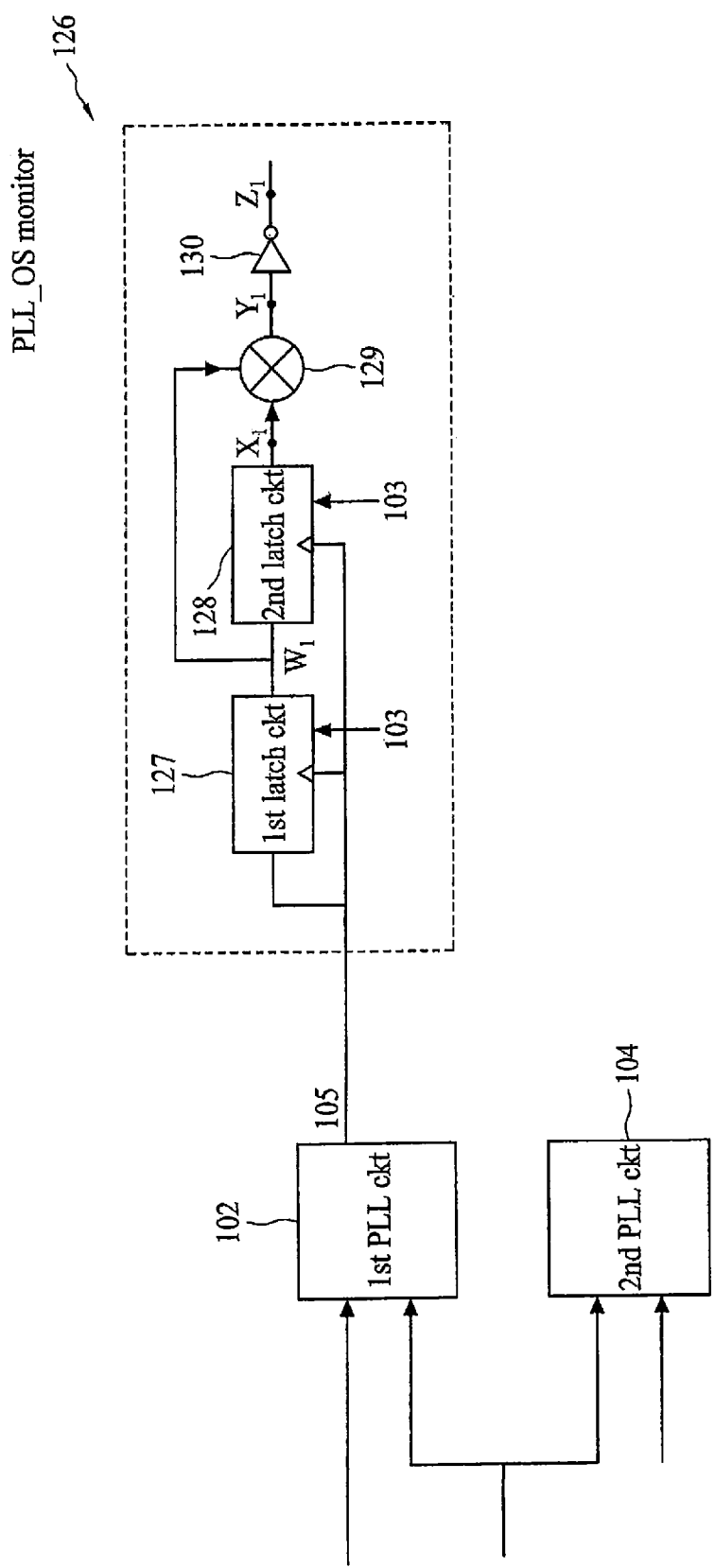
FIG. 2B illustrates an exemplary circuit diagram of a PLL output signal (PLL_OS) monitor of the PLL monitor circuit of FIG. 1, in accordance with some embodiments.

FIG. 2B illustrates an exemplary circuit diagram of the PLL_OS monitor 126, in accordance with various embodiments. As shown, the PLL_OS monitor 126 includes a first latch circuit 127, a second latch circuit 128, an XOR logic gate (hereinafter "XOR gate") 129, and an inverter 130. In some embodiments, the first and second latch circuits 127 and 128 each includes a D flip-flop circuit configured to output a signal that tries to follow an input signal to the D flip-flop circuit in accordance with a clock signal, as described above. In the illustrated embodiment of the PLL_OS monitor 126, the first D flip-flop circuit 127 is configured to receive the PLL output signal 105 as its input signal, and output a signal at node "$W_1$" (hereinafter "signal $W_1$") in accordance with a logical state of the PLL output signal 105. The second D flip-flop circuit 128 is configured to receive the signal $W_1$ as its input signal, and output a signal at node "$X_1$" (hereinafter "signal $X_1$") also in accordance with the PLL output signal 105. Further, both of the first and second D flip-flop circuits 127 and 128 are each configured to receive the reset signal 103 (also shown in FIG. 1). In some embodiments, the PLL_OS monitor 126 may reset the first and second D flip-flop circuits (127 and 128) before the PLL_OS monitor 126 performs an examination process, which will be discussed in further detail below. The XOR gate 129 is configured to perform an XOR logic function on the signals $W_1$ and $X_1$, and output a signal at node $Y_1$ (hereinafter "signal $Y_1$"). The inverter 130 is configured to provide a signal at node $Z_1$ (hereinafter "signal $Z_1$") that is logically inverted to the signal $Y_1$.

In some embodiments, the first and second D flip-flop circuits (127 and 128) may be respectively reset by the reset signal 103, as mentioned above. As such, the output signals of the first and second D flip-flop circuits 127 and 128, i.e., the signals $W_1$ and $X_1$, are reset to LOW, respectively. Then, the first D flip-flop circuit 127 receives the PLL output signal 105, and latches a first logical state of the PLL output signal 105 as the signal W1. More specifically, the first logical state of the PLL output signal 105 may reflect a logical state of the PLL output signal 105 at time "t1." Subsequently, the first logical state (i.e., the signal $W_1$) is latched by the D flip-flop circuit 128 as the signal $X_1$. In some embodiments, subsequently to or simultaneously with the XOR gate 129 XOR'ing the signals $X_1$ and $W_1$, the first flip-clop circuit 127 is configured to latch a second logical state of the PLL output signal 105 as the "new" signal $W_1$. In some embodiments, the second logical state of the PLL output signal 105 may reflect a logical state of the PLL output signal 105 at time "t2," wherein t2 is later than t1. As such, the signal $W_1$ and the signal $X_1$ received by the XOR gate 129 may represent a current logical state (e.g., at time t2) and a previous logical state (e.g., at time t1) of the PLL output signal 105, respectively. Based on the operation principle of an XOR gate as shown below in Table 1.

TABLE 1

| Input 1 | Input 2 | Output |
|---------|---------|--------|
| 0 | 0 | 0 |
| 0 | 1 | 1 |
| 1 | 0 | 1 |
| 0 | 1 | 0 |

In some embodiments, the current logical state (the signal $W_1$) and previous logical state (the signal $X_1$) of the PLL output signal 105 may be used as the "Input 1" and "Input 2" of the XOR gate 129, respectively, and a logical state of the signal $Y_1$ may be represented by the "Output" of the XOR gate 129. Thus, when the current and previous logical states of the PLL output signal 105 respectively represent different logical states, the logical state of the signal $Y_1$ is HIGH. And when the current and previous logical states of the PLL output signal 105 each represents an identical logical state, the logical state of the signal $Y_1$ is LOW. Further, through the inverter 130, the signal $Z_1$ represents a logical inversion of the signal $Y_1$. In some embodiments, the signal $Z_1$ corresponds to the signal 126' (FIG. 1). When the signal 126' is at HIGH (the signal $Y_1$ is at LOW), the PLL_OS monitor 126 may determine that the PLL output signal 105 is stuck or floating, and/or the PLL output signal 105 misses one or more pulses; and, on the other hand, when the signal 126' is at LOW (the signal $Y_1$ is at HIGH), the PLL_OS monitor 126 may determine that the PLL output signal 105 doesn't have the above-mentioned issues. More specifically, as described above, when the signal $Y_1$ is at LOW (the signal 126' at HIGH), the previous and current logical states of the PLL output signal 105 may share an identical logical state, which means that the PLL output signal 105 has not oscillated for at least a pulse-wide duration. In some embodiments, such a non-oscillation issue may be due to missing pulse(s) of the PLL output signal 105, a floating PLL output signal 105, and/or a stuck PLL output signal 105. It is noted that a person with ordinary skill in the art would understand the operation of the PLL_OS monitor 126 based on the above-provided description. Thus, for clarity purposes, a timing diagram for illustrating the operation of the PLL_OS monitor 126 is omitted.

Figure 2C:
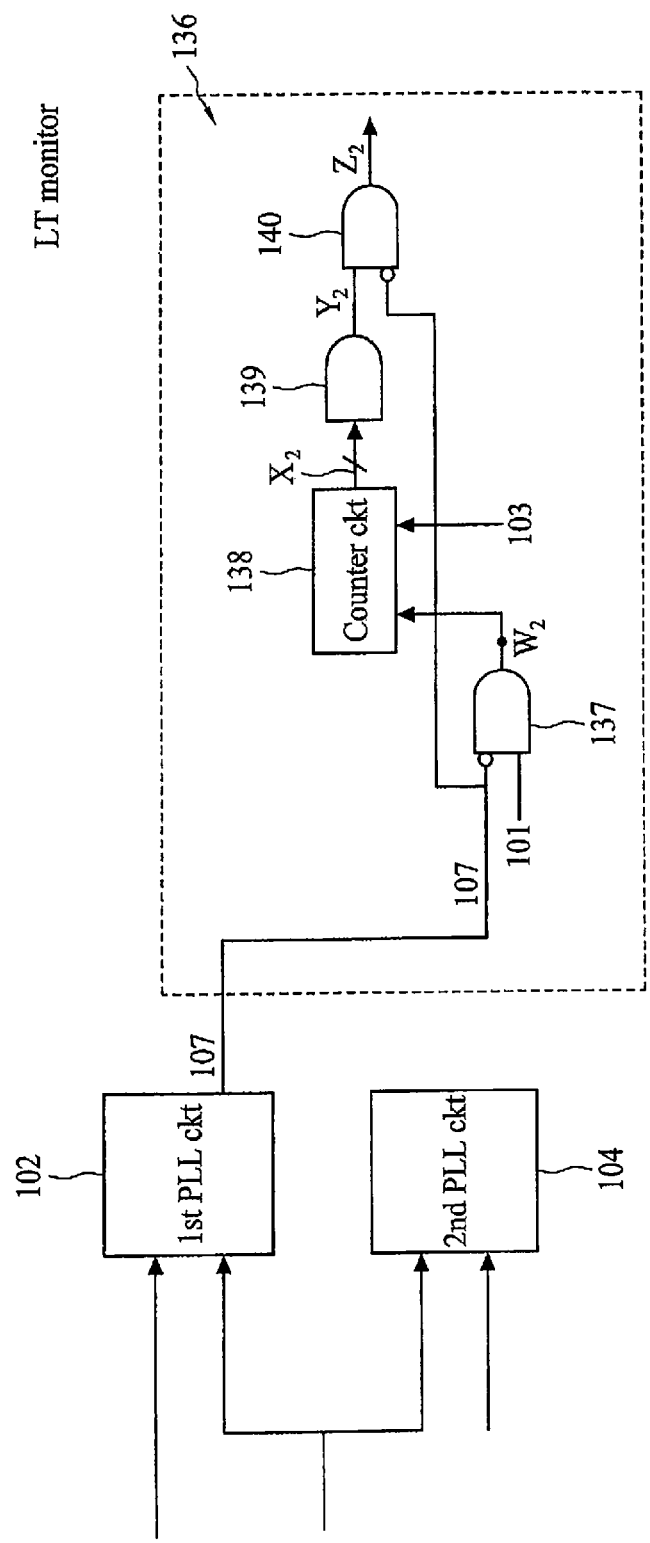
FIG. 2C illustrates an exemplary circuit diagram of a lock time (LT) monitor of the PLL monitor circuit of FIG. 1, in accordance with some embodiments.

FIG. 2C illustrates an exemplary circuit diagram of the LT monitor 136, in accordance with various embodiments. As shown, the LT monitor 136 includes a first AND gate 137, a counter circuit 138, a second AND gate 139, and a third AND gate 140. As described above, the LT monitor 136 is configured to examine whether the main PLL circuit 102 has exceeded a predetermined amount of time to provide a locked PLL output signal (e.g., 105). Operations of the LT monitor 136 will be described in further detail below.

In some embodiments, the first AND gate 137 is configured to receive a logical inversion of the signal 107 and the signal 101 at its inputs, and output a signal at node "$W_2$" (hereinafter "signal $W_2$"). As described above, the signal 107 indicates whether the main PLL circuit 102 reaches a locked status. If so, the signal 107 may be asserted to HIGH. If not, the signal may be asserted to LOW. In some embodiments, the LT monitor 136 is configured to check whether the main PLL circuit 102 has taken too long to reach a locked status. Thus, in the following discussion, the signal 107 remains at LOW unless the main PLL circuit 102 reaches a locked status. In some embodiments, the signal $W_2$ may accordingly reflect (or mirror) the reference clock signal 101. The signal $W_2$ is then provided to the counter circuit 138. In some embodiments, the counter circuit 138 is configured to dynamically count how many pulses the signal $W_2$ (i.e., the reference clock signal 101) includes, and provide a signal at node "$X_2$" (hereinafter "signal $X_2$"). More specifically, in some embodiments, the counter circuit 138 is configured to be reset by the reset signal 103 before counting, such that an initial number of pulses (before counting) of the reference clock signal 101 resets to zero. In some embodiments, the signal $X_2$ incudes one or more bits, and a combination of a logical state of each bit of the signal $X_2$ corresponds to a number of pulses of the reference clock signal 101. More specifically, the counter circuit 138 includes a watchdog counter circuit that counts to a pre-defined threshold, wherein such a pre-defined threshold may correspond to a maximum number of pulses within which the main PLL circuit 102 needs to reach a locked status. When the counter circuit 138 determines that the number of pulses of the signal 101 reaches the pre-defined threshold, the counter circuit 138 may output each of the bits of the signal $X_2$ at HIGH. Accordingly, the second AND gate 139 performs an AND logic function on the one or more bits, and outputs a signal at node "$Y_2$" (hereinafter "signal $Y_2$"). In the above example, each of the bits is at HIGH so that the signal $Y_2$ is asserted, by the second AND gate 139, to HIGH based on an AND logic function. The third AND gate 140 then performs the AND logic function on the signal $Y_2$ (at HIGH) and an inversion of the signal 107 (still at LOW) so as to output a signal at node $Z_2$ (hereinafter "signal $Z_2$") at HIGH. In some embodiments, the signal $Z_2$ corresponds to the signal 136'. When the signal 136' is at HIGH, the LT monitor 136 determines that the main PLL circuit 102 has taken too long to reach a locked status. On the other hand, when the signal 136' is at LOW, the LT monitor 136 determines that the main PLL circuit 102 has reached a locked state within a pre-defined duration. It is noted that a person with ordinary skill in the art would understand the operation of the LT monitor 136 based on the above-provided description. Thus, for clarity purposes, a timing diagram for illustrating the operation of the LT monitor 136 is omitted.

Figure 2D:
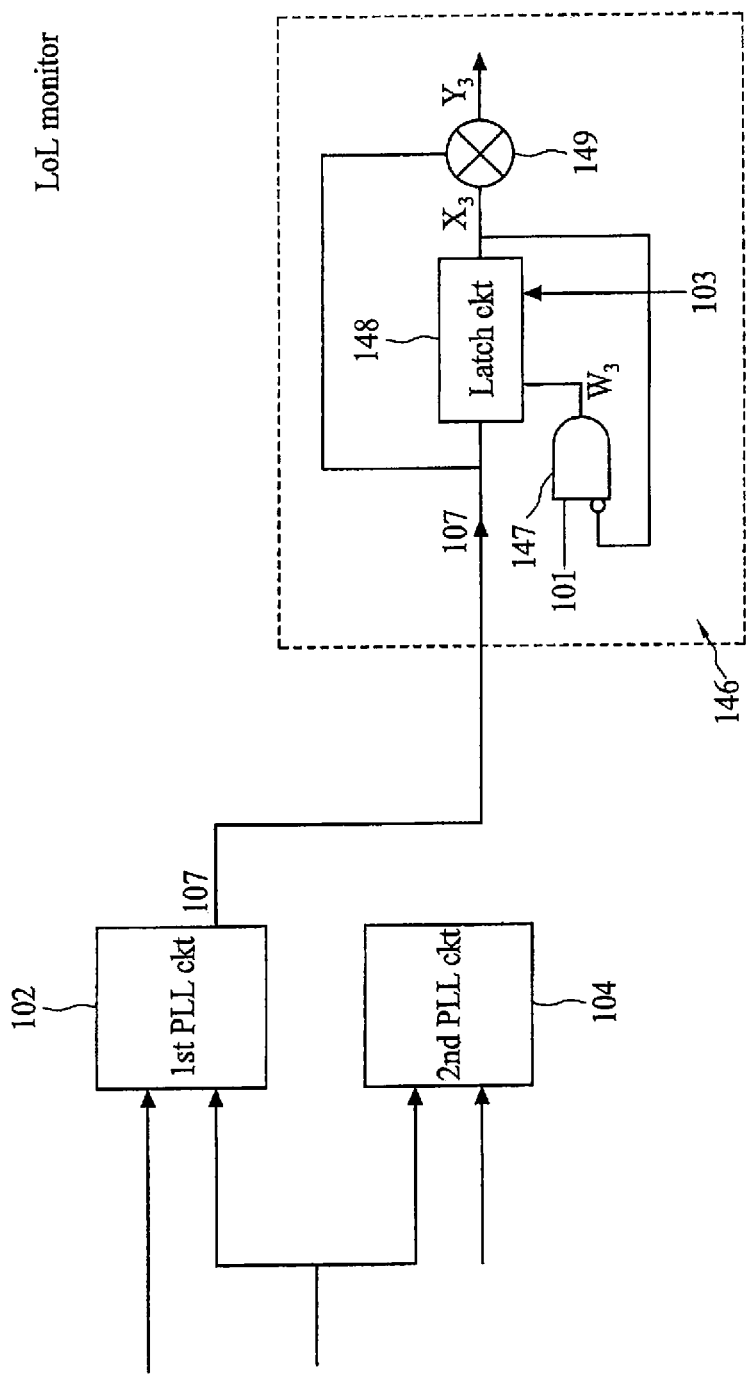
FIG. 2D illustrates an exemplary circuit diagram of a loss of lock (LoL) monitor of the PLL monitor circuit of FIG. 1, in accordance with some embodiments.

FIG. 2D illustrates an exemplary circuit diagram of the LoL monitor 146, in accordance with various embodiments. As shown, the LoL monitor 146 includes an AND gate 147, a latch circuit 148, and an XOR gate 149. The latch circuit 148 may include a D flip-flop circuit that operates similarly to the above-discussed D flip-flop circuits (e.g., 119, 121, and 128). In some embodiments, the LoL monitor 146 is configured to detect whether a previously locked PLL output signal loses its locked status, which will be discussed in further detail below.

In some embodiments, the latch circuit 148 is reset to LOW by the reset signal 103 before the LoL monitor 146 performs an examination process. Then after the main PLL circuit 102 reaches a locked status, i.e., the PLL output signal 105 is locked with the reference clock signal 101, the signal 107 is asserted to HIGH, as mentioned above. Based on the above-described operation principle of a D flip-flop circuit, the HIGH signal 107 is latched by the latch circuit 148 to provide a signal at node $X_3$ (hereinafter "signal $X_3$") so that the signal $X_3$ is at HIGH. The AND gate 147 is configured to receive the reference clock signal 101 and a logical inversion of the signal $X_3$ at its inputs so as to provide a signal at node $W_3$ (hereinafter "signal $W_3$").

Further, in some embodiments, the signal $W_3$ is provided to the D flip-flop circuit 148 as its clock signal. Since the logical inversion of the HIGH signal $X_3$, the signal $W_3$ remains at LOW, which means that the D flip-flop circuit 148 may not update the signal $X_3$ until the signal $W_3$ transitions from LOW to HIGH. That is, the signal $X_3$ remains at HIGH. In some embodiments, the signal 107 may subsequently transition from HIGH to LOW, which indicates that the main PLL circuit 102 loses the lock status. Accordingly, the XOR gate 149 performs an XOR logic function on such an updated signal 107 and the signal $X_3$, which remains at HIGH, so as to output a signal at node $Y_3$ (hereinafter "signal $Y_3$") at HIGH. In some embodiments, the signal $Y_3$ corresponds to the signal 146'. That is, when the LoL monitor 146 transitions the signal $Y_3$ (146') from LOW to HIGH, the main PLL circuit 102 may have lost a lock status on a previously locked signal. It is noted that a person with ordinary skill in the art would understand the operation of the LoL monitor 146 based on the above-provided description. Thus, for clarity purposes, a timing diagram for illustrating the operation of the LoL monitor 146 is omitted.

Figure 2E:
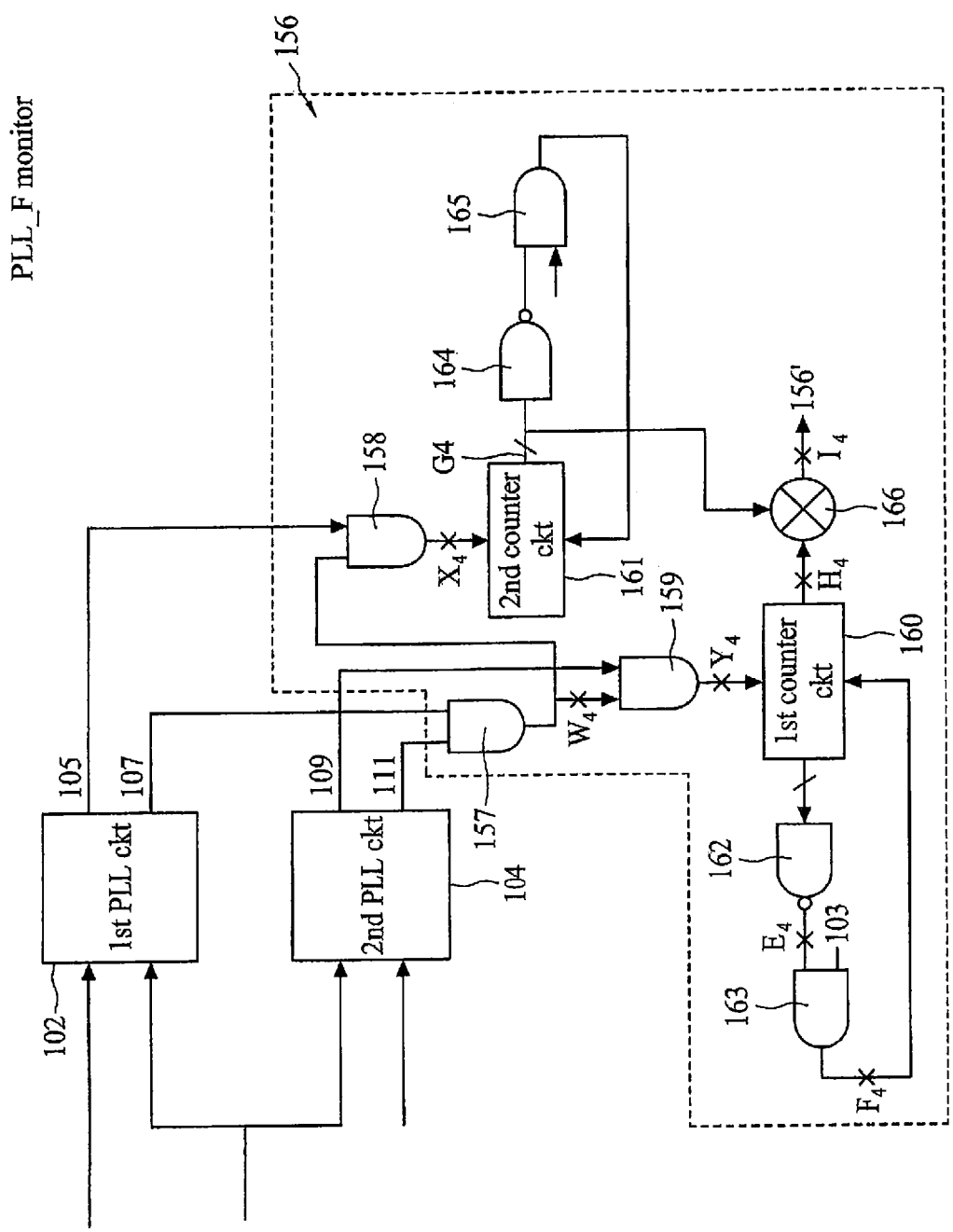
FIG. 2E illustrates an exemplary circuit diagram of a PLL frequency (PLL_F) monitor of the PLL monitor circuit of FIG. 1, in accordance with some embodiments.

FIG. 2E illustrates an exemplary circuit diagram of the PLL_F monitor 156, in accordance with various embodiments. As shown, the PLL_F monitor 156 includes plural AND gates (157, 158, 159, 163, and 165), a first counter circuit 160, a second counter circuit 161, a first NAND gate 162, a second NAND gate 164, and a comparator 166. In some embodiments, the PLL_F monitor 156 is configured to examine whether an already locked signal (e.g., the PLL output signal 105) has one or more of the following issues: an incorrect frequency, missing pulse(s), unneeded pulse(s), and an intolerable amount of jitter noise. Operations of the PLL_F monitor 156 will be described in further detail below.

In some embodiments, the PLL_F monitor 156 is configured to examine a presence of the above-mentioned issues after the main PLL circuit 102 and the reference PLL circuit 104 each reaches a respective locked status. That is, the PLL output signal 105 is locked with the reference clock signal 101, and the signal 107 indicative of the lock status of the main PLL circuit 102 is at HIGH; the PLL output signal (also the first reference signal) 109 is locked with the reference clock signal 101, and the signal 11 indicative of the lock status of the reference PLL circuit 104 is at HIGH.

Accordingly, the AND gate 157 is configured to receive the signals 107 and 111 so as to provide a signal at node $W_4$ (hereinafter "signal $W_4$") by performing an AND logic function of the signals 107 and 111. In some embodiments, the signal $W_4$, together with the PLL output signal 105, are received by the AND gate 158 at its inputs so as to provide a signal at node $X_4$ (hereinafter "signal $X_4$") by performing an AND logic function of the signals 105 and $W_4$. The signal $X_4$ is then provided to the second counter circuit 161 for counting a number of pulses of the PLL output signal 105 that is provided as a signal at node "$G_4$" (hereinafter "signal $G_4$"). In some embodiments, the signal $W_4$, together with the first reference signal 109 (also the PLL output signal of the reference circuit 104), are received by the AND gate 159 at its inputs so as to provide a signal at node $Y_4$ (hereinafter "signal $Y_4$") by performing an AND logic function of the signals 109 and $W_4$. The signal $Y_4$ is then provided to the second counter circuit 160 for counting a number of pulses of the PLL output signal 109 that is provided as a signal at node "$H_4$" (hereinafter "signal $H_4$").

In some embodiments, the first and second counter circuits 160 and 161 each includes a watchdog counter circuit (e.g., counter circuit 138 of FIG. 2C). As described above, a watchdog counter circuit typically has a pre-defined threshold. When the watchdog counter circuit determines that a counted number of an input signal (e.g., a counted number of pulses of the PLL output signal 105, a counted number of pulses of the PLL output signal 109, etc.) reaches the pre-defined threshold, the watchdog counter circuit may assert one or more of its output bits to HIGH. As such, the counter circuit 160 may start to count the number of pulses of the PLL output signal 109 once the signal $Y_4$ is asserted to HIGH (i.e., the reference PLL circuit 104 is locked). And when the counted number of pulses of the PLL output signal 109 has reached the pre-defined threshold, one or more output bits (a signal at node "$Z_4$") are all asserted to HIGH, which causes the NAND 162 to output a signal at node "$E_4$" (hereinafter "signal $E_4$") at LOW. In some embodiments, the AND gate 163 is configured to receive the signal $E_4$ and the reset signal 103 at its inputs, and output a signal at node "$F_4$" (hereinafter "signal $F_4$"). In some embodiments, the reset signal 103 is asserted to HIGH after the main PLL circuit 102 and the reference PLL circuit 104 have been locked, respectively. As such, the signal $F_4$ is asserted to LOW so that the counter circuit 160 is reset. After the reset, the counter circuit 160 may count the number of pulses from zero. In some embodiments, the counter circuit 161 performs a substantially similar function to the counter circuit 160 using respective coupled components, e.g., the NAND gate 164 and the AND gate 165. Thus, for brevity, discussions of the counter circuit 161 and corresponding NAND gate 164 and AND gate 165 are omitted.

Referring still to FIG. 2E, the comparator 166 is configured to compare the signals $G_4$ and $H_4$ that represent the numbers of pulses of the PLL output signals 105 and 109, respectively. More specifically, the comparator 166 compares the two numbers of pulses, and if a difference of the two numbers is greater than 1, the PLL_O monitor 156 may assert a signal at node "$I_4$" (hereinafter "signal $I_4$") to HIGH. In some embodiments, the signal 14 corresponds to the signal 156'. Such a HIGH signal 156' may be due to an incorrect frequency of the PLL output signal 105, missing pulse(s) of the PLL output signal 105, unneeded pulse(s) of the PLL output signal 105, and/or an intolerable amount of jitter noise of the PLL output signal 105, in accordance with various embodiments of the present disclosure. It is noted that a person with ordinary skill in the art would understand the operation of the PLL_F monitor 156 based on the above-provided description. Thus, for clarity purposes, a timing diagram for illustrating the operation of the PLL_F monitor 156 is omitted.

In some embodiments, the reference PLL_OS monitor 166 is substantially similar to the PLL_OS monitor 126 except that the reference PLL_OS monitor 166 is configured to receive the PLL output signal 109 (the first reference signal). As such, the reference PLL_OS monitor 166 may examine whether the PLL output signal 109 is floating, stuck, and/or missing pulse(s). If a presence of one or more of the above issues is detected, the reference PLL_OS monitor 166 may assert the signal 166' to HIGH. The reference LoL monitor 176 is substantially similar to the LoL monitor 146 except that the reference LoL monitor 176 is configured to receive the second reference signal 111 indicative of a lock status of the reference PLL circuit 104. As such, the reference LoL monitor 176 may examine whether a previously locked signal (e.g., the PLL output signal 109) loses its lock status. If a presence of the above issues is detected, the reference LoL monitor 176 may assert the signal 176' to HIGH.

By examining the first and second reference signals 109 and 111 before the PLL monitor circuit 106 reports any issue of the main PLL circuit 102 (i.e., asserting one or more of the signals 116', 126', 136', 146', and 156' to HIGH), in accordance with some embodiments, the PLL monitor circuit 106 may more accurately pinpoint a source of a detected issue. For example, if the reference PLL circuit 104 malfunctions as described above, at least one of the signals 166' and 176' is asserted to HIGH (by the reference PLL_OS monitor 166 and/or the reference LoL monitor 176). As such, the OR gate 184 that performs an OR logic function on the signals 166' and 176' may assert the signal 183 to HIGH so that the malfunctioning reference PLL circuit 104 is recognized.

To recap, the signals 116', 126', 136' 146', and 156' are provided by the MPV monitor 116, the PLL_OS monitor 126, the LT monitor 136, the LoL monitor 146, and the PLL_O monitor 156, respectively, to examine the main PLL circuit 102, in accordance with some embodiments. As described above, the MPV monitor 116 asserts the signal 116' to HIGH when detecting a minimum pulse width violation of the PLL output signal 105; the PLL_OS monitor 126 asserts the signal 126' to HIGH when detecting a stuck or floating PLL output signal 105, and/or missing pulse(s) of the PLL output signal 105; the LT monitor 136 asserts the signal 136' to HIGH when detecting an exceeded amount of time to reach a lock status; the LoL monitor 146 asserts the signal 146' to HIGH when detecting a loss of a previous lock status; the PLL_F monitor 156 asserts the signal 156' to HIGH when detecting an incorrect frequency of the PLL output signal 105. As such, when the reference PLL_OS monitor 166 determines that the PLL output signal 109 doesn't have a corresponding issue (i.e., the signal 166' asserted to LOW) and the MPV monitor 116 determines that that the main PLL circuit 102 has malfunctioned (i.e., the signal 116' asserted to HIGH), the AND gate 180 performs an AND logic function on the logical states of the signal 116' and the logical inversion of the signal 166' so as to assert the signal 181 to HIGH.

Similarly, when the reference PLL_OS monitor 166 and the reference LoL monitor 176 respectively determine the reference PLL circuit 104 functions correctly and the PLL_F monitor 156 determines the main PLL circuit 102 has functioned incorrectly, the signals 166' and 176' are both asserted to LOW and the signal 156' is asserted to HIGH. Accordingly, the AND gate 182 performs an AND logic function on the logical states of the logical inversion of the signal 166', the logical inversion of the signal 176', and the signal 156'. As such, the signal 181 is asserted to HIGH. According to various embodiments of the present disclosure, when the signal 181 is asserted to HIGH, the PLL monitor circuit 106 may determine that the main PLL circuit 102 malfunctions due to one or more of the above-described issues.

Figure 4:
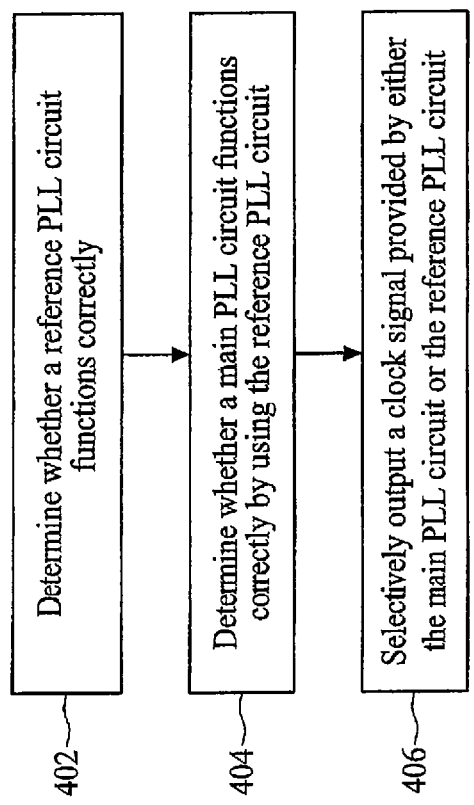
FIG. 4 illustrates an exemplary flow chart of a method for operating the PLL monitor circuit of FIG. 1, in accordance with various embodiments.

FIG. 4 illustrates an exemplary flow chart of a method 400 to detect one or more issues of the main PLL circuit 102, in accordance with various embodiments. In various embodiments, the operations of the method 400 are performed by the respective components illustrated in FIGS. 1-2E. For purposes of discussion, the following embodiment of the method 300 will be described in conjunction with FIGS. 1-2E. The illustrated embodiment of the method 300 is merely an example. Therefore, it should be understood that any of a variety of operations may be omitted, re-sequenced, and/or added while remaining within the scope of the present disclosure.

The method 400 starts with operation 402 in which the PLL monitor circuit 106 determines whether the reference PLL circuit 104 functions correctly, in accordance with various embodiments. As described above, in some embodiments, the reference PLL_OS monitor 166 is configured to detect whether the first reference signal 109 is stuck, floating, and/or missing pulse(s), and the reference LoL monitor 176 is configured to detect whether the reference PLL circuit 104 loses its lock status.

The method 400 continues to operation 404 in which the PLL monitor circuit 106 determines whether the main PLL circuit 102 functions correctly by using the reference PLL circuit 104, in accordance with various embodiments. More specifically, the PLL monitor circuit 106 includes the MPV monitor 116, the PLL_OS monitor 126, the LT monitor 136, the LoL monitor 146, and the PLL_F monitor 156. As described above, each of the monitors (116, 126, 16, 146, and 156) may examine the main PLL circuit 102 to pinpoint one or more issues by using the PLL output signal 105, the signal 107, the first reference signal 109, and/or the second reference signal 111.

The method 400 continues to optional operation 406 in which the PLL monitor circuit 106 may selectively output a clock signal provided by either the main PLL circuit 102 or the reference PLL circuit 104, in accordance with various embodiments. For example, if the PLL monitor circuit 106 detects one or more issues of the main PLL circuit 102, the PLL monitor circuit 106 may output a clock signal using the PLL output signal 109 provided by the reference PLL circuit 104. And if the PLL monitor circuit 106 detects one or more issues of the reference PLL circuit 104, the PLL monitor circuit 106 may output a clock signal using the PLL output signal 105 provided by the main PLL circuit 102.

In an embodiment, a clock distribution circuit configured to output a clock signal is disclosed. The circuit includes a first circuit configured to use a reference clock signal to provide first and second reference signals, wherein the second reference signal indicates whether the first reference signal is locked with the reference clock signal; a second circuit configured to use the reference clock signal to provide an output signal and an indication signal indicative whether the output signal is locked with the reference clock signal; and a monitor circuit, coupled to the first and second circuits, and configured to use at least one of the first reference signal, the second reference signal, the output signal, and the indication signal to determine whether the second circuit is functioning correctly.

In another embodiment, a clock distribution circuit configured to output a clock signal is disclosed. The circuit includes a first phase locked loop (PLL) circuit configured to use a reference clock signal to provide first and second reference signals, wherein the second reference signal indicates whether the first reference signal is locked with the reference clock signal; a second PLL circuit configured to use the reference clock signal to provide a PLL output signal and an indication signal indicative whether the PLL output signal is locked with the reference clock signal; and a PLL monitor circuit, coupled to the first and second PLL circuits, and configured to use at least one of the first reference signal, the second reference signal, the PLL output signal, and the indication signal to determine whether the second PLL circuit is functioning correctly, and use at least one of the first reference signal and the second reference signal to determine whether the first PLL circuit is functioning correctly.

Yet in another embodiment, a method includes: using a reference phase locked loop (PLL) circuit to provide a first reference signal and a second reference signal, wherein the second reference signal indicates whether the first reference signal is locked with a reference clock signal; using a main PLL circuit to provide an indication signal and an output signal, wherein the indication signal is indicative whether the output signal is locked with the reference clock signal; and determining whether a main PLL circuit functions correctly using at least one of the first reference signal, the second reference signal, the output signal, and the indication signal.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock distribution circuit configured to output a clock signal, comprising:
    a first circuit configured to use a reference clock signal to provide at least one reference signal;
    a second circuit configured to use the reference clock signal to provide an output signal and an indication signal indicative of whether the output signal is locked with the reference clock signal; and
    at least one monitor circuit, coupled to the first and second circuits, and configured to use at least one of the at least one reference signal, the output signal, and the indication signal to determine whether the second circuit is functioning correctly, wherein the at least one monitor circuit comprises:
    a first monitor circuit configured to determine whether the second circuit has exceeded a predetermined amount of time to provide the output signal that is locked with the reference signal, the first monitor circuit comprising:
        a first AND gate configured to receive a first signal indicative of whether the second circuit reaches a locked status and output a second signal that mirrors the reference clock signal;
        a counter circuit configured to receive the second signal and count a number of pulses the second signal includes, and output a third signal that indicates when a number of pulses included in the second signal reaches a pre-defined threshold;
        a second AND gate configured to receive the third signal, perform an AND logic function on one or more bit values contained in the third signal, and output a fourth signal; and
        a third AND gate configured to receive the fourth signal and the first signal, perform an AND logic function on the first and fourth signals, and output a fifth signal indicative of whether the second circuit has exceeded the predetermined amount of time to provide the output signal that is locked with the reference signal.

2. The circuit of claim 1, wherein the at least one monitor circuit further comprises:
    a second monitor circuit configured to use the at least one reference signal and the output signal to determine whether the output signal comprises a presence of a minimum pulse width violation, wherein the second monitor circuit comprises:
        a first latch circuit configured to latch a heterodyned signal of the first reference signal and the output signal as a first output signal based on the output signal;
        at least one gate, coupled to the first latch circuit, and configured to delay the first output signal by a pre-defined pulse width; and
        a second latch circuit, coupled to the at least one gate, and configured to latch the delayed first output signal as a second output signal based on a logical inversion of the second output signal,
        wherein the second monitor circuit is configured to determine whether the output signal comprises a pulse width shorter than the pre-defined pulse width based on a logical state of the second output signal.

3. The circuit of claim 1, wherein the at least one monitor circuit further comprises a second monitor circuit, the second monitor circuit comprising:
    a first latch circuit;
    a second latch circuit, coupled to the first latch circuit; and
    a logic gate, coupled to the second latch circuit, and configured to perform an XOR logic function on a previous logical state of an output signal that is provided by the second latch circuit, and a current logical state of an output signal that is provided by the first latch circuit to provide an XOR' ed signal,
    wherein the first monitor circuit uses a logical state of the XOR'ed signal to determine whether the output signal misses a pulse, the output signal is stuck, and/or the output signal is floating.

4. The circuit of claim 3, wherein the second monitor circuit is further configured to determine whether the first circuit loses a lock status.

5. The circuit of claim 1, wherein the at least one monitor circuit further comprises a second monitor circuit comprising:
    a latch circuit configured to latch a logical state of the indication signal in accordance with the reference clock signal; and
    a logic gate, coupled to the latch circuit, and configured to perform an XOR logic function on a current logical state and a previous logical state of the indication signal so as to determine whether the first circuit loses the lock status.

6. The circuit of claim 1, wherein the at least one monitor circuit comprises a second monitor circuit that is configured to determine whether the second circuit is experiencing at least one of the following issues: an incorrect frequency, one or more missing pulses, one or more unneeded pulses, and an amount of jitter noise that exceeds a predetermined threshold.

7. The circuit of claim 6, wherein the second monitor circuit comprises:
    a first counter circuit configured to count a number of pulses of the output signal;
    a second counter circuit configured to count a number of pulses of the first reference signal; and
    a comparator circuit, coupled to the first and second counter circuits, and configured to provide a difference between the numbers of pulses of the output signal and the first reference signal so as to indicate whether the second circuit
is experiencing at least one of the following issues: an incorrect frequency, one or more missing pulses, one or more unneeded pulses, and an amount of jitter noise that exceeds a predetermined threshold.

8. The circuit of claim 1, wherein the at least one reference signal comprises a first reference signal and a second reference signal, and the at least one monitor circuit is further configured to use at least one of the first reference signal and the second reference signal to determine whether the first circuit is functioning correctly.

9. The circuit of claim 8, wherein the at least one monitor circuit further comprises first and second reference monitor circuits, and wherein the first reference monitor circuit is configured to determine whether the first reference signal misses a pulse, the output signal is stuck, and/or the output signal is floating, and the second reference monitor circuit is configured to determine whether the first circuit loses a lock status.

10. A clock distribution circuit configured to output a clock signal, comprising: a first phase locked loop (PLL) circuit configured to use a reference clock signal to provide first and second reference signals, wherein the second reference signal indicates whether the first reference signal is locked with the reference clock signal;
  a second PLL circuit configured to use the reference clock signal to provide a PLL output signal and an indication signal indicative of whether the PLL output signal is locked with the reference clock signal; and
  a PLL monitor circuit, coupled to the first and second PLL circuits, and configured to use at least one of the first reference signal, the second reference signal, the PLL output signal, and the indication signal to determine whether the second PLL circuit is functioning correctly, and use at least one of the first reference signal and the second reference signal to determine whether the first PLL circuit is functioning correctly, wherein the PLL monitor circuit comprises:
  a first monitor circuit configured to determine whether the second circuit has exceeded a predetermined amount of time to provide the output signal that is locked with the reference signal, the first monitor circuit comprising:
    a first AND gate configured to receive a first signal indicative of whether the second circuit reaches a locked status and output a second signal that mirrors the reference clock signal;
    a counter circuit configured to receive the second signal and count a number of pulses the second signal includes, and output a third signal that indicates when a number of pulses included in the second signal reaches a pre-defined threshold;
    a second AND gate configured to receive the third signal, perform an AND logic function on one or more bit values contained in the third signal, and output a fourth signal; and
      a third AND gate configured to receive the fourth signal and the first signal, perform an AND logic function on the first and fourth signals, and output a fifth signal indicative of whether the second circuit has exceeded the predetermined amount of time to provide the output signal that is locked with the reference signal.

11. The circuit of claim 10, wherein the PLL monitor circuit comprises second, third, fourth, and fifth monitor circuits that are each configured to use at least one of the first reference signal, the second reference signal, the PLL output signal, and the indication signal to output a respective signal indicative of whether the second PLL circuit is functioning properly.

12. The circuit of claim 11, wherein the second monitor circuit is configured to detect whether the PLL output signal is stuck, floating, and/or misses one or more pulses, the third monitor circuit is configured to determine whether the second PLL circuit takes an exceeded amount of time to reach a locked status, the fourth monitor circuit is configured to detect whether the second PLL circuit loses a locked status, and the fifth monitor circuit is configured to determine whether the PLL output signal comprises at least one of the issues: an incorrect frequency, one or more missing pulses, one or more unneeded pulses, and an intolerable amount of jitter noise.

13. The circuit of claim 12, wherein the PLL monitor circuit further comprises sixth and seventh monitor circuits, the sixth monitor circuit being configured to use the first reference signal to determine whether the first reference signal is stuck, floating, and/or misses one or more pulses, the seventh monitor circuit being configured to use the second reference signal to determine whether the first PLL circuit loses a locked status.

14. The circuit of claim 10, wherein the at least one monitor circuit comprises a second monitor configured to determine whether the output signal misses a pulse, the output signal is stuck, and/or the output signal is floating, the second monitor circuit comprising:
  a first latch circuit;
  a second latch circuit, coupled to the first latch circuit;
  a first logic gate, coupled to the second latch circuit, and configured to perform an XOR logic function on a previous logical state of the output signal that is provided by the second latch circuit, and a current logical state of the output signal that is provided by the first latch circuit to provide an XOR'ed signal, wherein the first monitor circuit uses a logical state of the XOR'ed signal to determine whether the output signal misses a pulse, the output signal is stuck, and/or the output signal is floating; and
  one or more second logic gates and a multiplexer coupled to each other, that are configured to output the clock signal using either the PLL output signal or the first reference signal.

15. The circuit of claim 10, wherein the at least one monitor circuit further comprises a second monitor circuit configured to use the at least one reference signal and the output signal to determine whether the output signal comprises a presence of a minimum pulse width violation, wherein the second monitor circuit comprises:
  a first latch circuit configured to latch a heterodyned signal of the first reference signal and the output signal as a first output signal based on the output signal;
  at least one gate, coupled to the first latch circuit, and configured to delay the first output signal by a pre-defined pulse width; and
  a second latch circuit, coupled to the at least one gate, and configured to latch the delayed first output signal as a second output signal based on a logical inversion of the second output signal,
  wherein the second monitor circuit is configured to determine whether the output signal comprises a pulse width shorter than the pre-defined pulse width based on a logical state of the second output signal.

16. A method, comprising:
  using a reference phase locked loop (PLL) circuit to provide a first reference signal and a second reference signal, wherein the second reference signal indicates whether the first reference signal is locked with a reference clock signal;

using a main PLL circuit to provide an indication signal and an output signal, wherein the indication signal is indicative of whether the output signal is locked with the reference clock signal; and determining whether the main PLL circuit functions correctly, wherein the determining comprises using at least one of the first reference signal, the second reference signal, the output signal, and the indication signal, and wherein the determining further comprises:

determining whether the main PLL circuit has exceeded a predetermined amount of time to provide the output signal that is locked with the reference signal.

17. The method of claim 16, further comprising:
selectively outputting a clock signal based on either the first reference signal or the output signal; and
based on the first reference signal and the output signal, determining whether the output signal comprises a presence of a minimum pulse width violation.

18. The method of claim 16, further comprising:
determining whether the output signal comprises a pulse width shorter than a pre-defined pulse width.

19. The method of claim 16, further comprising:
determining whether the main PLL circuit is experiencing at least one of the following issues: an incorrect frequency, one or more missing pulses, one or more unneeded pulses, and an amount of jitter noise that exceeds a predetermined threshold.

* * * * *